US012663706B2

(12) United States Patent (10) Patent No.: US 12,663,706 B2

Kashiwaya et al. (45) Date of Patent: Jun. 23, 2026

(54) EUV TRANSMISSIVE FILM

(71) Applicant: NGK INSULATORS, LTD.,
Nagoya-City (JP)

(72) Inventors: Toshikatsu Kashiwaya, Inazawa-City
(JP); Atsuo Kondo, Okazaki-City (JP);
Hiroki Chaen, Yokohama-City (JP);
Takashi Tanimura, Handa-City (JP);
Naoki Goriki, Kasugai-City (JP)

(73) Assignee: NGK INSULATORS, LTD., Nagoya
(JP)

( * ) Notice: Subject to any disclaimer, the term of this
patent is extended or adjusted under 35
U.S.C. 154(b) by 375 days.

(21) Appl. No.: 18/310,609

(22) Filed: May 2, 2023

(65) Prior Publication Data

US 2023/0305192 A1 Sep. 28, 2023

Related U.S. Application Data

(63) Continuation of application No.
PCT/JP2022/034590, filed on Sep. 15, 2022.

(30) Foreign Application Priority Data

Oct. 20, 2021 (WO) ................. PCT/JP2021/038811

(51) Int. Cl.
*G03F 1/22* (2012.01)
*G02B 1/14* (2015.01)

(52) U.S. Cl.
CPC ................. *G03F 1/22* (2013.01); *G02B 1/14*
(2015.01)

(58) Field of Classification Search
CPC ........ G02B 1/14; G02B 5/208; G02B 5/1838;
G03F 1/24; G03F 1/38; G03F 1/62; G03F
7/70191
See application file for complete search history.

(56) References Cited

U.S. PATENT DOCUMENTS

| | | | |
|---|---|---|---|
| 10,228,615 B2 | 3/2019 | Nikipelov et al. | |
| 10,712,659 B2 | 7/2020 | Gallagher et al. | |
| 2001/0021239 A1 | 9/2001 | Itoga et al. | |
| 2009/0274962 A1* | 11/2009 | Kubota | .................. B82Y 10/00 430/5 |

(Continued)

FOREIGN PATENT DOCUMENTS

| | | |
|---|---|---|
| EP | 2 927 746 B1 | 9/2021 |
| JP | H01-162332 A | 6/1989 |

(Continued)

OTHER PUBLICATIONS

W. de la Cruz a, G. Soto a, F. Yubero, Beryllium nitride: an
alternative material to beryllium for extreme ultraviolet and soft
X-ray uses, Optical Materials 25, 39-42 (Year: 2004).*

(Continued)

*Primary Examiner* — Bijan Ahvazi

(74) *Attorney, Agent, or Firm* — Muncy, Geissler, Olds &
Lowe, P.C.

(57) ABSTRACT

There is provided an EUV transmissive membrane having
an EUV transmittance of 80.0% or more at a wavelength of
13.5 nm and including a main layer having an IR emissivity
of 2.0% or more at a wavelength of 2 µm and a protective
layer that covers at least one side of the main layer and has
an IR transmittance of 70% or more at a wavelength of 2 µm.

6 Claims, 3 Drawing Sheets

(56) References Cited

U.S. PATENT DOCUMENTS

| | | | | |
|---|---|---|---|---|
| 2017/0205704 A1* | 7/2017 | Nikipelov | ........... | G03F 7/70958 |
| 2018/0259845 A1 | 9/2018 | Nam et al. | | |
| 2018/0348626 A1 | 12/2018 | Ahn et al. | | |

FOREIGN PATENT DOCUMENTS

| | | | |
|---|---|---|---|
| JP | H10-340843 | A | 12/1998 |
| JP | 2000-338299 | A | 12/2000 |
| JP | 2001-221689 | A | 8/2001 |
| JP | 2009-271262 | A | 11/2009 |
| JP | 2017-522590 | A | 8/2017 |
| JP | 2018-151622 | A | 9/2018 |
| JP | 2018-194840 | A | 12/2018 |
| JP | 6858817 | B2 | 4/2021 |
| WO | 2020/078721 | A1 | 4/2020 |

OTHER PUBLICATIONS

Extended European Search Report dated May 13, 2025 (Application No. 22883267.1).

U.S. Appl. No. 18/173,955, filed May 2, 2023.

English translation of the Written Opinion dated Dec. 6, 2022 (Application No. PCT/JP2022/034590).

English translation of the Written Opinion dated Dec. 21, 2021 (Application No. PCT/JP2021/038811).

International Search Report and Written Opinion (Application No. PCT/JP2022/034590) dated Dec. 6, 2022 (9 pages).

International Search Report and Written Opinion (Application No. PCT/JP2021/038811) dated Dec. 21, 2021 (9 pages).

De La Cruz et al., "*Beryllium Nitride: An Alternative Material to Beryllium for Extreme Ultraviolet and Soft X-ray Uses,*" Optical Materials, Elsevier Science Publishers B.V. Amsterdam, NL, vol. 25, No. 1, Feb. 1, 2004 (Feb. 1, 2004).

Extended European Search Report dated Apr. 4, 2024 (Application No. 21954413.7).

U.S. Office Action dated Aug. 25, 2025 (U.S. Appl. No. 18/173,955).

* cited by examiner (a) 20

(b) 22 20 22

(c) 24 22 20 22 24

(d) 24 22a 20 22 24

(e) 22a 20 22

(f) 26 22a 20 22

EUV TRANSMISSIVE FILM

CROSS-REFERENCE TO RELATED APPLICATIONS

This application is a continuation application of PCT/JP2022/034590 filed Sep. 15, 2022, which claims priority to PCT/JP2021/038811 filed Oct. 20, 2021, the entire contents all of which are incorporated herein by reference.

BACKGROUND OF THE INVENTION

1. Field of the Invention

The present invention relates to an EUV transmissive membrane.

2. Description of the Related Art

With miniaturization in semiconductor manufacturing process advancing year by year, various improvements have been made in each step. Particularly, in a photolithography step, extreme ultraviolet (EUV) light having a wavelength of 13.5 nm has begun to be used in place of conventional ArF exposure having a wavelength of 193 nm. As a result, the wavelength was reduced to $\frac{1}{10}$ or less at once, and optical properties thereof were completely different. Since there is no material having a high transmittance to EUV light, however, there is still no practical pellicle, which serves as a particle adhesion-preventing membrane of, for example, a photomask (reticle). For this reason, device manufacturers currently cannot use pellicles when manufacturing semiconductor devices.

Therefore, a poly-Si based pellicle membrane has been proposed. For example, Patent Literature 1 (JP6858817B) discloses a pellicle membrane including a core layer that contains a material substantially transparent for EUV radiation such as (poly-) Si and a cap layer that contains a material absorbing IR radiation.

A carbon nanotube (CNT)-based pellicle membrane has also been developed (Patent Literature 2 (JP2018-194840A)), which is expected to have higher EUV transmittance.

Furthermore, for example, Patent Literature 3 (JP2017-522590A) discloses a membrane that is transmissive to EUV radiation with high and low-doped regions, which is expected to improve temperature characteristics of the membrane.

CITATION LIST

Patent Literature

Patent Literature 1: JP6858817B
Patent Literature 2: JP2018-194840A
Patent Literature 3: JP2017-522590A

SUMMARY OF THE INVENTION

Although rays of EUV light that do not pass through a pellicle membrane are reflected or absorbed by the pellicle membrane, heat is generated when the pellicle membrane absorbs the EUV light. When the amount of heat generated is large, wrinkles are generated in the pellicle membrane due to thermal expansion to cause a distribution in the EUV transmittance. As a result, a variation occurs in circuit formation during exposure, which may lead to circuit defects. In addition, depending on the material of the pellicle membrane, the pellicle membrane may be damaged due to heating over the resistance limit temperature. Therefore, heat must be dissipated from the pellicle membrane by some means, but the pellicle membrane is too thin, i.e., less than 100 nm thick, to dissipate heat sufficiently by thermal conduction. Moreover, even though hydrogen is introduced into an EUV exposure apparatus, heat dissipation due to convection hardly occurs because of the vacuum. Therefore, the heat dissipation of the pellicle membrane is generally performed by radiation. Patent Literature 1 (JP6858817B) discloses a pellicle membrane for a lithography apparatus including a main layer and a protective layer for improving IR emissivity and particularly describes a metal such as Pd or Ag as the protective layer in a case where the main layer is Si. In other words, a pellicle membrane has been proposed that dissipates heat by IR radiation from the protective layer rather than the main layer. However, a metal such as Pd or Ag, which is considered a protective layer having high IR emissivity, has low EUV transmittance and thus does not provide a pellicle membrane having both practical EUV transmittance and high IR emissivity.

Here, in the case of heat dissipation by radiation, IR light is mainly emitted among rays having various wavelengths. This is because the wavelength of a ray emitted from an object is determined by the temperature of the object. In fact, when the pellicle membrane is heated to a temperature of about 500 to 800° C. during exposure, a ray having a wavelength of 1 to 2 μm is most emitted in this temperature range. Accordingly, there is a demand for a pellicle membrane having not only high EUV transmittance but also high emissivity of IR light having a wavelength of about 2 μm.

The inventors have recently found that by combining a main layer having high IR emissivity and a protective layer having high IR transmittance to constitute an EUV transmissive membrane having an EUV transmittance of 80.0% or more, it is possible to provide an EUV transmissive membrane having not only high EUV transmittance but also high IR emissivity.

Accordingly, an object of the present invention is to provide an EUV transmissive membrane having not only high EUV transmittance but also high IR emissivity.

The present invention provides the following aspects:
[Aspect 1]

An EUV transmissive membrane having an EUV transmittance of 80.0% or more at a wavelength of 13.5 nm, the EUV transmissive membrane comprising:

a main layer having an IR emissivity of 2.0% or more at a wavelength of 2 μm; and a protective layer that covers at least one side of the main layer and has an IR transmittance of 70% or more at a wavelength of 2 μm.

[Aspect 2]

The EUV transmissive membrane according to Aspect 1, wherein both sides of the main layer are covered with a pair of the protective layer.

[Aspect 3]

The EUV transmissive membrane according to Aspect 1 or 2, wherein the main layer comprises at least one selected from the group consisting of Be, Si, and $B_4C$ as a main component.

[Aspect 4]

The EUV transmissive membrane according to Aspects 1 to 3, wherein the protective layer is composed of at least one selected from the group consisting of calcium fluoride, silicon dioxide, and beryllium nitride.

[Aspect 5]

The EUV transmissive membrane according to Aspects 1 to 4, wherein the main layer comprises an additive.

[Aspect 6]

The EUV transmissive membrane according to Aspect 5, wherein a constituent element of the additive has an electronegativity that is 0.3 or higher or 0.3 or lower than the electronegativity of a major constituent element of the main layer.

[Aspect 7]

The EUV transmissive membrane according to Aspect 5 or 6, wherein the additive comprises at least one element selected from the group consisting of Rb, Sr, Y, Nb, Mo, Si, K, Ca, B, and C.

[Aspect 8]

The EUV transmissive membrane according to Aspects 5 to 7, wherein the main layer comprises Be as a main component, and the content of the additive is 5 to 40 at % with respect to the content of Be in the main layer.

[Aspect 9]

The EUV transmissive membrane according to Aspects 1 to 8, wherein the main layer has a thickness of 10 to 70 nm.

[Aspect 10]

The EUV transmissive membrane according to Aspects 1 to 9, wherein the protective layer has a thickness of 5 nm or less.

DETAILED DESCRIPTION OF THE INVENTION

EUV Transmissive Membrane

Figure 1:
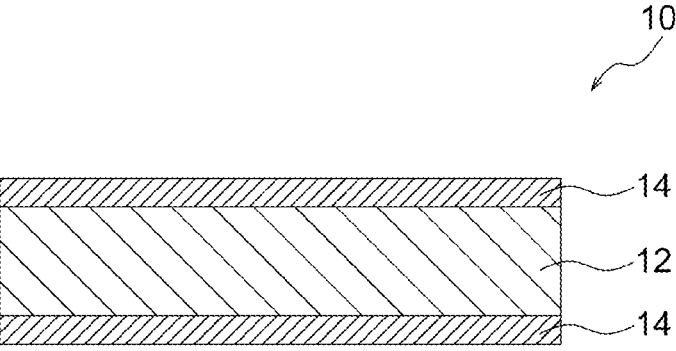
FIG. 1 is a schematic cross-sectional view illustrating an embodiment of an EUV transmissive membrane according to the present invention.

FIG. 1 illustrates a schematic cross-sectional view of an EUV transmissive membrane 10 according to an embodiment of the present invention. An EUV transmissive membrane 10 has an EUV transmittance of 80.0% or more at a wavelength of 13.5 nm. The EUV transmissive membrane 10 includes a main layer 12 and a protective layer 14 that covers at least one side of the main layer. The main layer 12 has an IR emissivity of 2.0% or more at a wavelength of 2 μm, while the protective layer 14 has an IR transmittance of 70% or more at a wavelength of 2 μm. Thus, by combining a main layer having high IR emissivity and a protective layer having high IR transmittance with respect to IR light at a wavelength of 2 μm to constitute an EUV transmissive membrane having an EUV transmittance of 80.0% or more, it is possible to provide an EUV transmissive membrane having not only high EUV transmittance but also high IR emissivity.

In other words, the pellicle membrane has high transmittance to EUV light but slightly absorbs EUV light. Even though the amount of EUV light absorbed is small, the pellicle membrane generates heat due to continuous irradiation of high-energy EUV light during exposure. At this time, even if the temperature of the pellicle membrane rises, the temperature of a pellicle frame rises only slightly through thermal conduction. Thus, although the pellicle membrane expands, the pellicle frame does not expand so much, causing wrinkles in the pellicle. As a result, since the EUV transmittance distribution in the plane of the pellicle membrane increases or the strength of the pellicle membrane decreases, the pellicle membrane may be damaged by the force generated by the rapid acceleration and rapid stop of a reticle during the exposure process. Here, the heat dissipation of the pellicle membrane is generally performed by radiation. Patent Literature 1 (JP6858817B) discloses a pellicle membrane for a lithography apparatus including a main layer and a protective layer for improving IR emissivity and particularly describes a metal such as Pd or Ag as the protective layer in a case where the main layer is Si. In other words, a pellicle membrane has been proposed that dissipates heat by IR radiation from the protective layer rather than the main layer. However, Pd and Ag, which are considered as protective layers having high IR emissivity, have low EUV transmittance and thus do not provide a pellicle membrane having both practical EUV transmittance and high IR emissivity. All these problems are successfully solved by the EUV transmissive membrane 10 of the present invention. In other words, the EUV transmissive membrane 10 of the present invention can dissipate heat generated by the absorption of the EUV light by the IR radiation from the main layer while increasing the EUV transmittance of the EUV transmissive membrane 10 by combining a main layer having both high EUV transmittance and high IR emissivity (e.g., a layer composed of metal) and a protective layer having both high EUV transmittance and high IR transmittance (e.g., a layer composed of a nonmetal). Accordingly, even if the EUV transmissive membrane 10 generates heat by absorbing the EUV light, the IR light is emitted from the main layer 12, and the protective layer 14 transmits the IR light emitted from the main layer 12, thereby emitting the IR light to the outside of the EUV transmissive membrane 10 to dissipate the heat. Therefore, the temperature rise of the EUV transmissive membrane 10 is suppressed.

Physical phenomena when a material is irradiated with a ray include transmission, reflection, and absorption, and a relational equation of transmittance+reflectance+absorptivity=1 is established, the ray exhibits any one of the above three phenomena. The sum of a transmission amount, a reflection amount, and an absorption amount of the ray is equal to the irradiation amount of the ray. Moreover, absorptivity=emissivity (radiation rate), and a material having high absorptivity for a given ray will also have high emissivity for the ray. However, since transmittance+reflectance+absorptivity=1, a material having a transmittance and absorptivity (=emissivity) of more than 0.5 does not exist. The above relational equation is satisfied for a specific wavelength, and it is possible to have an EUV transmittance of 0.95 or more at a wavelength of 13.5 nm and an emissivity of 0.1 for the main ray (IR ray at a wavelength of 2 μm) of the heat dissipation by radiation.

The EUV transmissive membrane 10 has an EUV transmittance of 80.0% or more, preferably 85.0% or more, more preferably 90.0% or more, and even more preferably 93.0% or more at a wavelength of 13.5 nm. Since a higher EUV transmittance is desirable, the upper limit is not particularly limited. Although the upper limit is ideally 100%, the EUV transmissive membrane 10 can typically have a EUV transmittance of 99% or less, more typically 98% or less, and even more typically 95% or less.

The main layer 12 has an IR emissivity of 2.0% or more, preferably 2.5% or more, more preferably 5.0% or more, even more preferably 8.0% or more, particularly preferably 13.0% or more, and most preferably 15.0% or more at a wavelength of 2 μm. Since a higher IR emissivity is desirable, the upper limit is not particularly limited, but the main layer 12 can typically have an IR emissivity of 30.0% or less, more typically 27.5% or less, and even more typically 25.0% or less.

The main layer 12 preferably contains at least one selected from the group consisting of Be, Si, and $B_4C$ as a main component, more preferably contains Be or Si as a main component, and even more preferably contains Be as a main component. In other words, the main layer 12 may contain a ceramic material having a low electrical resistance equivalent to that of a metal such as $B_4C$, in addition to a metal material having a particularly high EUV transmittance, such as Be or Si. Here, the "main component" in the main layer 12 means a component that accounts for 98.0% by weight or more, preferably 99.0% by weight or more, and more preferably 99.5% by weight or more of the main layer 12. Meanwhile, the main layer 12 may be composed of at least one selected from the group consisting of Be, Si, and $B_4C$. In this way, the main layer can be made to have high EUV transmittance and high IR emissivity more effectively while ensuring basic functions as a pellicle membrane (such as particle adhesion preventing function). From this viewpoint, the thickness of the main layer 12 is preferably 10 to 70 nm, more preferably 15 to 50 nm, and even more preferably 20 to 35 nm. In addition, the thickness of the main layer 12 is preferably 5 nm or more given maintaining a mechanical strength sufficient for practical use. On the other hand, since it is preferable to make the main layer 12 as thin as possible given increasing the EUV transmittance, the thickness of the main layer 12 is preferably 50 nm or less, more preferably 40 nm or less, and even more preferably 30 nm or less.

The protective layer 14 is a layer for protecting the main layer 12. Accordingly, the protective layer 14 covers at least one side of the main layer 12, and it is preferable to cover both sides of the main layer 12 with a pair of the protective layer 14. The protective layer 14 has an IR transmittance of 70% or more, preferably 75% or more, more preferably 78% or more, and even more preferably 80% or more at a wavelength of 2 μm. Since a higher IR transmittance is desirable, the upper limit is not particularly limited, but the protective layer 14 can typically have an IR transmittance of 90% or less, more typically 87% or less, and even more typically 85% or less.

The protective layer 14 is a layer for protecting the main layer 12 in the fabrication process of the EUV transmissive membrane 10 as described above, and is formed for the purpose of preventing oxidation of the main layer 12 and preventing reaction (e.g., oxidation or corrosion) with chemicals in the process. On the other hand, it is desirable that the protective layer 14 has high transmittance to IR light in order not to disturb IR radiation from the main layer 12. Furthermore, it is desirable that the protective layer 14 also has high EUV transmittance. From this viewpoint, the protective layer 14 is preferably composed of at least one selected from the group consisting of calcium fluoride, silicon dioxide, and beryllium nitride, more preferably composed of silicon dioxide or beryllium nitride, and even more preferably composed of beryllium nitride. However, the protective layer 14 does not need to be composed only of these compounds as long as 99% by weight or more, preferably 99.5% by weight or more, and even more preferably 99.8% by weight or more of the protective layer 14 may be composed of these compounds. The term "beryllium nitride" as used herein means a comprehensive composition that allows not only a stoichiometric composition such as $Be_3N_2$ but also a non-stoichiometric composition such as $Be_3N_{2-x}$, wherein $0 < x < 2$. The same is also applicable to other compound names such as calcium fluoride and silicon dioxide.

The protective layer 14 preferably has a thickness of 5 nm or less, and more preferably 3 nm or less. The lower limit of the thickness of the protective layer 14 is not particularly limited, but is typically 0.3 nm or more, and more typically 0.5 or more. When the thickness of the protective layer 14 is 5 nm or less, the EUV transmittance can be increased, and when the thickness of the protective layer 14 is 0.3 nm or more, basic functions as a protective layer such as an antioxidation function can be maintained.

As described above, the main layer 12 preferably contains at least one selected from the group consisting of Be, Si, and $B_4C$ as the main component, while the protective layer 14 is preferably composed of at least one selected from the group consisting of calcium fluoride, silicon dioxide, and beryllium nitride. In other words, the main layer 12 is preferably composed of a metal or a semimetal (particularly, a metal), and the protective layer 14 is preferably composed of a nonmetal. Here, the material is classified into a dielectric (insulator), which is non-metallic, and a non-dielectric (=conductor), which is metallic, both of which have varying IR emissivity as their thickness varies. In particular, when the membrane is thinner than 100 nm, the change appears remarkably. Specifically, the dielectric reduces IR emissivity as its thickness is reduced, whereas the non-dielectric has the characteristic of rapidly increasing IR emissivity as its thickness is reduced. Therefore, both the main layer 12 and the protective layer 14 exhibit high EUV transmittance, preferably, by combining the main layer 12 composed of a non-dielectric which is a metal having high EUV transmittance, and the protective layer 14 composed of a dielectric which is a nonmetal having high EUV transmittance while the main layer 12 has high IR emissivity and the protective layer 14 has low IR emissivity. Thus, the IR radiation emitted from the main layer 12 is transmitted without being absorbed by the protective layer 14 and emitted from the EUV transmissive membrane 10. The EUV transmissive membrane can be more effectively made to have not only high EUV transmittance but also high IR emissivity.

Now, a case where the main layer 12 contains Be as a main component is considered. Since beryllium is a metal, the thinner it is, the higher the IR emissivity. In this regard, the IR emissivity of Be at various thicknesses was calculated using optical theory and found to be 2.1% at a thickness of 100 nm, 2.9% at 50 nm, 4.4% at 30 nm, and 6.2% at 20 nm. In this calculation, the Be layer is assumed to be in an ideal specular state, and the IR reflectance in this case is assumed to be higher than the IR reflectance of the actual Be layer. For this reason, the IR emissivity of the Be layer in the optical theory calculation is calculated to be lower than the IR emissivity of the actual Be layer. In other words, the actual Be layer has higher IR emissivity than the above calculation results. On the other hand, theoretical calculations show that the EUV transmittance of the Be layer is 86.7% at a thickness of 100 nm. 93.1% at 50 nm, 95.8% at 30 nm, and 97.2% at 20 nm. In other words, the thinner the main layer 12 containing Be as a main component, the higher the EUV transmittance and the higher the IR emissivity.

The main layer 12 preferably contains an additive. This can further increase the IR emissivity of the main layer 12. When EUV light is irradiated onto the EUV transmissive membrane 10, the IR emissivity of the main layer 12 is considered to be higher because the additive becomes a scattering source of conduction electrons. However, if the EUV transmittance of the additive itself is low, the EUV transmittance of the main layer 12 will also decrease, and thus it is preferable to select an additive having high EUV transmittance. From this viewpoint, the constituent elements of the additive preferably have an electronegativity that is 0.3 or higher or 0.3 or lower, more preferably 0.33 or higher or 0.33 or lower, and even more preferably 0.35 or higher or 0.35 or lower than the electronegativity of the major constituent element of the main layer 12. The upper limit of the difference between the electronegativity of the constituent element of the additive and the electronegativity of the major constituent element of the main layer 12 is not particularly limited, but typically is 1.2 or less, and more typically 1.0 or less. Thus, the greater the difference between the electronegativity of the main component (e.g., Be) of the main layer 12 and the electronegativity of the additive, the greater the scattering power of the conduction electrons. The "major constituent element" of the main layer 12 as used herein means an element most abundantly contained in the main layer 12. For example, if the main layer 12 contains Be as a main component, the major constituent element is Be. Given the combination of EUV transmittance and electronegativity as described above, the additive preferably contains at least one element selected from the group consisting of rubidium (Rb), strontium (Sr), yttrium (Y), niobium (Nb), molybdenum (Mo), silicon (Si), potassium (K), calcium (Ca), boron (B), and carbon (C).

When the main layer 12 contains Be as a main component, the content of the additive is preferably 5 to 40 at %, more preferably 10 to 35 at %, and even more preferably 15 to 30 at % with respect to the Be content in the main layer 12. Similarly, when the main layer 12 contains Si as a main component, the content of the additive is preferably 5 to 40 at % with respect to the content of Si in the main layer 12, although the effect depends on the component of the additive. When the content of the additive is more than 5 at %, the above-described advantages of the additive can be effectively realized. When the content of the additive is less than 40 at %, the mechanical strength of the EUV transmissive membrane 10 can be maintained to make it less likely to be damaged, and the EUV transmittance of the main layer 12 can be increased. The content of these additives can be determined, for example, by cutting EUV transmissive membranes into cross sections by focused ion beam (FIB) processing to prepare samples, observing the samples with a transmission electron microscope (TEM) (JME-2100F, manufactured by JEOL Ltd.) at 200 kV, and analyzing elements with an EDS analyzer (JED-2300T, manufactured by JEOL Ltd.) at an acceleration voltage of 5 keV for elemental mapping and point analysis mode.

In the case of being composed of beryllium nitride, the protective layer 14 preferably has a nitrogen concentration gradient region where nitrogen concentration decreases as closer to the main layer 12. In other words, when the composition of beryllium nitride may include from the stoichiometric composition such as $Be_3N_2$ to the non-stoichiometric composition such as $Be_3N_{2-x}$, wherein $0<x<2$, as described above, the beryllium nitride constituting the protective layer 14 preferably has a gradient composition that is richer in beryllium as closer to the main layer 12. As a result, it is possible to improve the adhesion between the protective layer 14 (i.e., beryllium nitride layer) and the main layer 12 (e.g., metallic beryllium layer) and relieve stress caused by the difference in thermal expansion between the two layers. That is, it is possible to improve the adhesion between the two layers to suppress delamination, and to make delamination difficult as a thermal expansion relaxation layer between the two layers in the case of absorbing EUV light and becoming a high temperature. The thickness of the nitrogen concentration gradient region is preferably smaller than that of the protective layer 14. In other words, the entire thickness of the protective layer 14 does not need to be in the nitrogen concentration gradient region. For example, it is preferable that only a part of the thickness of the protective layer 14, for example, a region of preferably 10 to 70% and more preferably 15 to 50% of the thickness of the protective layer 14 is the nitrogen concentration gradient region.

In the EUV transmissive membrane 10, the main region for transmitting EUV is preferably in a form of the free-standing membrane. In other words, it is preferable that the substrate (e.g., Si substrate) used at the time of deposition remains as a border only at the outer edge of the EUV transmissive membrane 10, that is, no substrate (e.g., Si substrate) remains in the main region other than the outer edge. In short, the main region preferably consists of the main layer 12 and the protective layer 14.

Manufacturing Method

After a laminated membrane to be an EUV transmissive membrane is formed on a Si substrate, the EUV transmissive membrane according to the present invention can be fabricated by removing an unnecessary portion of the Si substrate through etching to form a free-standing membrane. Accordingly, the main portion of the EUV transmissive membrane is in the form of the free-standing membrane in which no Si substrate remains as described above.

(1) Preparation of Si Substrate

First, a Si substrate for forming a laminated membrane thereon is prepared. After the laminated membrane composed of the main layer 12 and the protective layer 14 is formed on the Si substrate, the main region (i.e., a region to be a free-standing membrane) other than the outer edge of the Si substrate is removed by etching. Accordingly, it is desirable to reduce the thickness of the Si substrate in the region to be formed into the free-standing membrane in advance in order to perform the etching efficiently in a short time. Therefore, it is desirable that a mask corresponding to the EUV transmission shape is formed on the Si substrate by employing a normal semiconductor process, and the Si substrate is etched by wet etching to reduce the thickness of the main region of the Si substrate to a predetermined thickness. The wet-etched Si substrate is cleaned and dried to prepare a Si substrate having a cavity formed by wet etching. The wet etching mask may be made of any material that is corrosion resistance to Si wet etchant, for example, $SiO_2$ is suitable for use. In addition, the wet etchant is not particularly limited as long as it is capable of etching Si. For example, TMAH (tetramethylammonium hydroxide) is preferred because it can be used under appropriate conditions, and very good anisotropic etching can be performed on Si.

(2) Formation of Laminated Membrane

The laminated membrane may be formed by any deposition method. An example of the preferred deposition method is the sputtering method. In the case of fabricating a three-layer structure of beryllium nitride/beryllium/beryllium nitride, it is preferable that the beryllium membrane as the main layer 12 is fabricated by sputtering using a pure Be target and the beryllium nitride membrane as the protective layer 14 is done by reactive sputtering. The reactive sputtering can be performed, for example, by adding nitrogen gas to the chamber during sputtering using a pure Be target, whereby beryllium and nitrogen react to each other to generate beryllium nitride. As another method, beryllium nitride can be produced by forming a beryllium membrane and then irradiating the membrane with nitrogen plasma to cause a nitriding reaction of beryllium, thereby generating beryllium nitride. In any case, synthetic methods for beryllium nitride are not limited thereto. Although it is preferable to use different beryllium targets for forming the beryllium nitride membrane and the beryllium membrane, it is also possible to use the same target for forming the beryllium nitride membrane and the beryllium membrane. The beryllium nitride and beryllium membranes may be formed in a one-chamber sputtering apparatus as in Examples described later, or a two-chamber sputtering apparatus may be used to form the beryllium nitride and beryllium membranes in separate chambers.

In the case of forming a nitrogen concentration gradient region in the beryllium nitride membrane as the protective layer 14, when depositing metallic beryllium from the beryllium nitride membrane, the introduction of nitrogen gas may be stopped and switched to metallic beryllium deposition while continuing a sputtering. In this way, a region is formed in which the nitrogen concentration in the film-deposited membrane decreases in the thickness direction as the concentration of nitrogen gas decreases. On the other hand, in the case of switching the metallic beryllium to the beryllium nitride, the nitrogen concentration gradient region can be formed by starting the introduction of nitrogen gas in the middle of the process while sputtering is performed, contrary to the above. The thickness of the nitrogen concentration gradient region can be controlled by adjusting the time for which the nitrogen gas concentration is changed.

In this manner, a laminated membrane with a three-layer structure of protective layer/main layer/protective layer can be fabricated. When an additive is contained in the main layer, the method of adding is not particularly limited as long as the additive is mixed in the main layer at a uniform concentration. Examples of the method of adding the additive to the main layer include:

(i) a method of depositing a film by sputtering using a target in which a predetermined amount of the additive is uniformly dispersed in the main layer material in advance, (ii) a method of simultaneously depositing a film by sputtering using two types of targets arranged in a sputtering apparatus, the target areas of which are corrected based on the sputtering rates and added amounts of the main layer material and the additive so that the main layer material and the additive are simultaneously film-deposited at a target ratio, and (iii) a method of alternately film-depositing the main layer material and the additive as ultrathin membranes (e.g., with a thickness on the order of sub-nm).

In the case of the alternating deposition method described in (iii) above, it may seem that a laminated structure in which a thin additive layer is sandwiched between the main layer materials is formed. However, since the film-deposited material penetrates to a certain depth by setting the conditions such that the energy of sputtering is increased, the additive Si reaches the inside of the beryllium layer. Particularly, the main layer becomes a uniform mixed state instead of a multi-layered state by controlling the thickness of each layer to be thin during film-deposition.

(3) Free-standing Membrane Formation

An unnecessary portion of the Si substrate other than the outer edge of the Si substrate where the composite membrane is formed, which is left as a border, is removed by etching to make the composite membrane free-standing. Etching of Si may be performed by any method, but etching with $XeF_2$ is preferred.

EXAMPLES

The present invention will be described in more detail with reference to the following examples.

Example 1

According to the procedures illustrated in FIGS. 2A and 2B, a composite free-standing membrane (EUV transmissive membrane) with a three-layer structure of beryllium nitride/beryllium/beryllium nitride was fabricated as follows.

(1) Preparation of Si Substrate

Figure 2A:
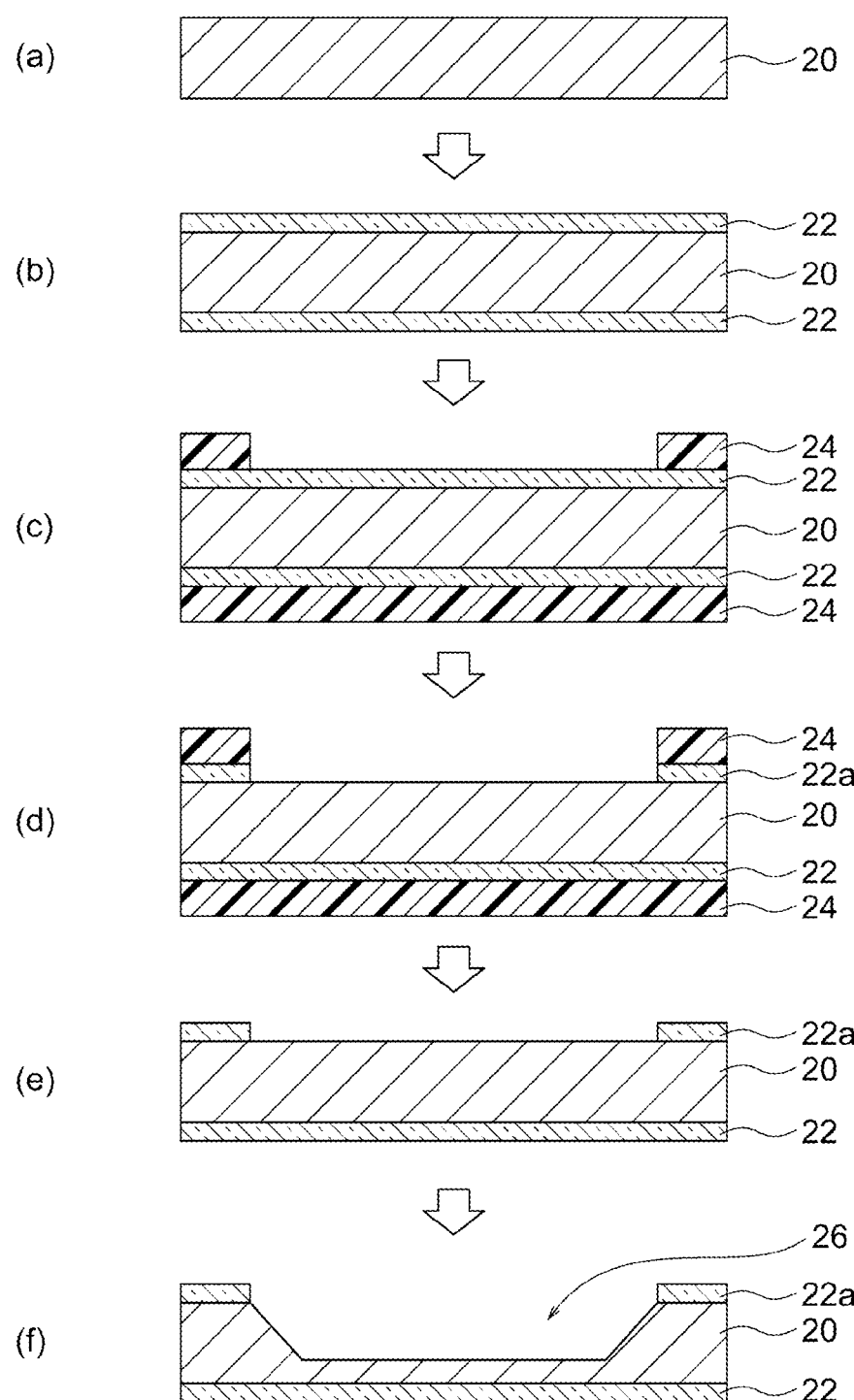
FIG. 2A is a process flow diagram illustrating the first half of a manufacturing procedure for an EUV transmissive membrane in Examples 1 to 4.
Figure 2B:
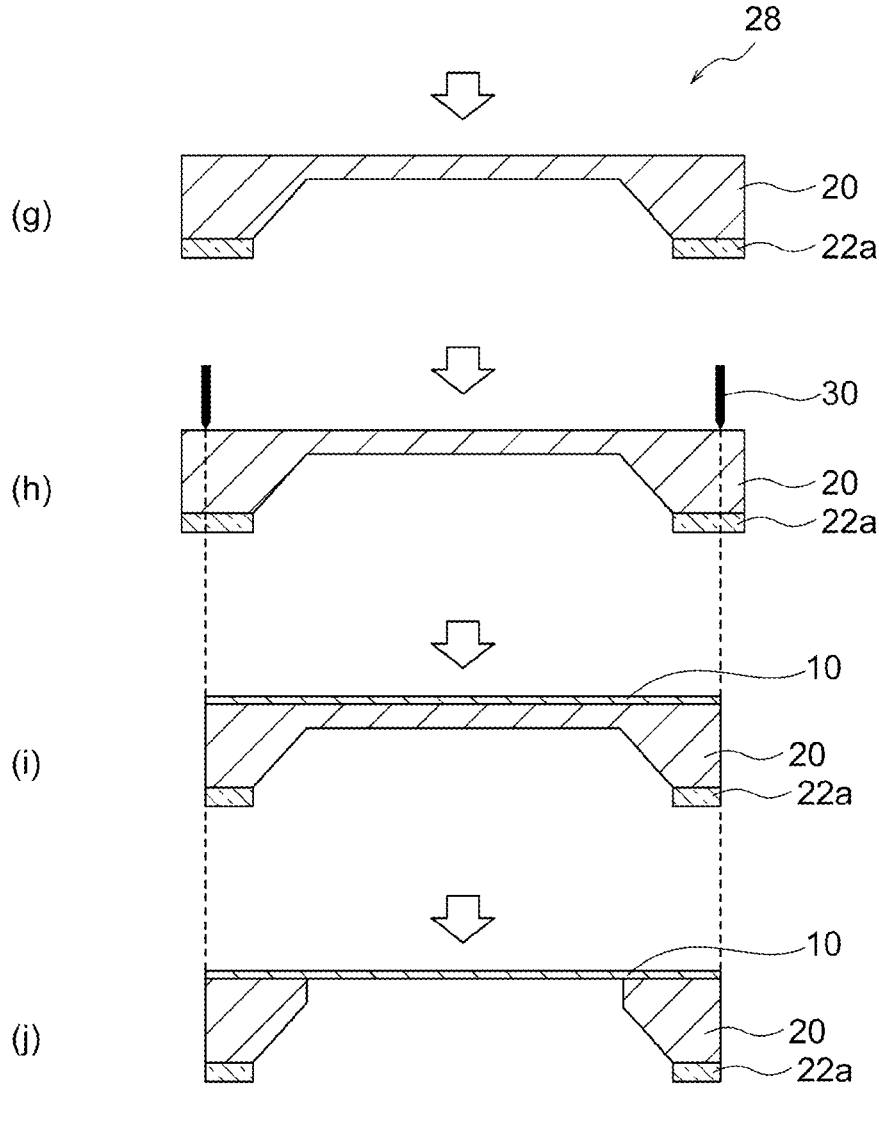
FIG. 2B is a process flow diagram illustrating the second half of a manufacturing procedure for an EUV transmissive membrane in Examples 1 to 4.

A Si wafer 20 having a diameter of 8 inches (20.32 cm) was prepared (FIG. 2A(a)). A $SiO_2$ membrane 22 having a thickness of 50 nm was formed on both sides of the Si wafer 20 by thermal oxidation (FIG. 2A(b)). Resist was applied to both sides of the Si wafer 20, and a resist mask 24 for $SiO_2$ etching was formed by exposure and development so that a 110 mm×145 mm resist hole was created on one side (FIG. 2A(c)). An exposed portion of the $SiO_2$ membrane 22 was etched and removed by wet-etching one side of the substrate with hydrofluoric acid to fabricate a $SiO_2$ mask 22a (FIG. 2A(d)). The resist mask 24 for $SiO_2$ etching was removed with an ashing apparatus (FIG. 2A(e)). Si was then etched with a TMAH solution. This etching was performed only for an etching time to obtain a target Si substrate having thickness of 50 μm with an etching rate measured in advance (FIG. 2A (f)). Finally, the $SiO_2$ membrane 22 formed on the surface not subjected to Si etching was removed and cleaned with hydrofluoric acid to prepare a Si substrate 28 (FIG. 2B(g)). The Si substrate outline may be diced with a laser 30, if necessary (FIG. 2B(h)), to achieve the desired shape (FIG. 2B(i)). In this way, a 110 mm×145 mm cavity 26 was provided at the center of the 8-inch (20.32 cm) Si wafer 20 to prepare the Si substrate 28 having a Si thickness of 50 μm in the cavity 26 portion.

(2) Formation of Composite Membrane

On the Si substrate 28 including the cavity 26 obtained in (1) above, a composite membrane with a three-layer structure of beryllium nitride/beryllium/beryllium nitride was formed as follows (FIG. 2B(i)). First, the Si substrate 28 was set in a sputtering apparatus, and a pure Be target was attached thereto. A chamber was evacuated, the flow ratio of argon gas and nitrogen gas was adjusted to 1:1 to carry out reactive sputtering at an internal pressure of 0.5 Pa, and the reactive sputtering was terminated at the time when 2 nm of beryllium nitride was film-deposited. Subsequently, sputtering was performed only with argon gas without introducing nitrogen gas, and the sputtering was terminated at the time when 30 nm of beryllium was film-deposited. Thereafter, reactive sputtering was performed while introducing nitrogen gas again in the same manner as in the first step, and the reactive sputtering was terminated at the time when 2 nm of beryllium nitride was film-deposited. In this manner, a composite membrane with 2 nm of beryllium nitride/30 nm of beryllium/2 nm of beryllium nitride was formed as the EUV transmissive membrane 10.

(3) Free-Standing Membrane Formation

The Si substrate 28 with the composite membrane prepared in (2) above was set in a chamber of an $XeF_2$ etcher capable of processing an 8-inch (20.32 cm) substrate. The chamber was sufficiently evacuated. At this time, if moisture remains in the chamber, the moisture reacts with the $XeF_2$ gas to generate hydrofluoric acid, and corrosion of the etcher or unexpected etching occurs. Therefore, the sufficient evacuation was performed. If necessary, vacuuming and nitrogen gas introduction were repeated in the chamber to reduce residual moisture in the chamber. When the sufficient evacuation was achieved, a valve between a $XeF_2$ material tank and a preliminary space was opened. As a result, $XeF_2$ was sublimated, and $XeF_2$ gas was also accumulated in the preliminary space. When the $XeF_2$ gas was sufficiently accumulated in the preliminary space, the valve between the preliminary space and the chamber was opened to introduce the $XeF_2$ gas into the chamber. The $XeF_2$ gas was decomposed into Xe and F, and F reacted with Si to generate $SiF_4$. Since the boiling point of $SiF_4$ was –95° C., $SiF_4$ generated was rapidly evaporated, causing a reaction of F with the newly exposed Si substrate. When the Si etching proceeded and F in the chamber decreased, the chamber was evacuated, and the $XeF_2$ gas was introduced into the chamber again to perform the etching. In this manner, the evacuation, the introduction of the $XeF_2$ gas, and the etching were repeated, and the etching was continued until the Si substrate 28 corresponding to the portion to be formed into the free-standing membrane disappeared. When the Si substrate of the unnecessary portion disappeared, the etching was terminated. In this way, a composite free-standing membrane having a border made of Si is obtained as the EUV transmissive membrane 10 (FIG. 2B(j)).

(4) IR Characteristics

The IR transmittance and IR reflectance at a wavelength of 2 μm were measured using an FT-IR spectrophotometer for the obtained EUV transmissive membrane to determine the IR absorptivity at a wavelength of 2 μm from the relational equation of transmittance+reflectance+absorptivity=1. The IR emissivity at a wavelength of 2 μm was determined from the fact that absorptivity=emissivity. The IR characteristics of the protective layer material were determined by film-depositing only the protective layer material on a calcium fluoride substrate having known IR characteristics by employing the same process as in (2) above, then performing measurement, and subtracting the influence (IR characteristics) of the calcium fluoride substrate from the obtained data. The IR characteristics of the main layer material were determined in the same manner as in the method used to determine the IR characteristics of the protective layer material. In this way, the IR emissivity at a wavelength of 2 μm in the main layer and the IR transmittance at a wavelength of 2 μm in the protective layer were determined. The results were as shown in Table 1.

(5) EUV Transmittance

EUV light having a wavelength of 13.5 nm was irradiated onto the obtained EUV transmissive membrane to measure the amount of transmitted EUV light with a sensor. The EUV transmittance was determined by comparing the obtained measurement value with a value obtained by directly measuring the amount of EUV light with a sensor without using the EUV transmissive membrane. The results were as shown in Table 1.

Example 2

A composite free-standing membrane was fabricated and evaluated in the same manner as in Example 1, except that the main layer contained Si as an additive by forming the composite membrane as follows. The results were as shown in Table 1.

(Formation of Composite Membrane)

On the Si substrate 28 including the cavity 26 obtained in (1) above, a composite membrane with a three-layer structure of beryllium nitride/Si-containing beryllium/beryllium nitride was formed as follows (FIG. 2B(i)). First, the Si substrate 28 was set in a multi-target sputtering apparatus, and a pure Be target and a Si target were attached thereto. A chamber was evacuated, the flow ratio of argon gas and nitrogen gas was adjusted to 1:1 to carry out reactive sputtering using the Be target at an internal pressure of 0.5 Pa, and the reactive sputtering was terminated at the time when 2 nm of beryllium nitride was film-deposited.

Subsequently, sputtering was performed only with argon gas at an internal pressure of 0.5 Pa by alternately using Be and Si targets without introducing nitrogen gas, and beryllium and Si were alternately film-deposited with a thickness on the order of sub-nm to form a main layer (a Si-containing beryllium membrane) on the beryllium nitride membrane. Switching between Be sputtering and Si sputtering was performed by opening and closing the shutters of the pure Be target and the Si target in the sputtering apparatus. At this time, the film-deposition time ratio of beryllium to Si was calculated from the film-deposition densities and sputtering rates of beryllium and Si so that the amount of Si added was 10 at % with respect to the Be content in the main layer, and beryllium and Si were alternately film-deposited such that each had a thickness on the order of sub-nm. Specifically, Be and Si were alternately film-deposited with a thickness of 0.16 nm and 0.04 nm, respectively, to form a main layer having a thickness of 30 nm. In this manner, a main layer containing beryllium as the main component and additive Si was formed. In this Example, the conditions are set such that the energy of sputtering is increased, and the film-deposited material penetrates to a certain depth, thus allowing the additive Si to reach the inside of the beryllium layer. Particularly, the main layer becomes a uniform mixed state instead of a multi-layered state by controlling the thickness of each layer to be thin during film-deposition.

Thereafter, reactive sputtering was performed using a pure Be target in a sputtering apparatus while introducing nitrogen gas again in the same manner as in the first step, and the reactive sputtering was terminated at the time when 2 nm of beryllium nitride was film-deposited. In this manner, a composite membrane with 2 nm of beryllium nitride/30 nm of Si-containing beryllium/2 nm of beryllium nitride was formed as the EUV transmissive membrane 10.

Example 3

A composite free-standing membrane was fabricated and evaluated in the same manner as in Example 2, except that Be and Si were alternately film-deposited with a thickness of 0.12 nm and 0.08 nm, respectively, to form a main layer having a thickness of 30 nm, such that the Si content was 20 at % with respect to the Be content in the main layer. The results were as shown in Table 1.

Example 4

A composite free-standing membrane was fabricated and evaluated in the same manner as in Example 2, except that Be and Si were alternately film-deposited with a thickness of 0.08 nm and 0.12 nm, respectively, to form a main layer having a thickness of 30 nm, such that the Si content was 40 at % with respect to the Be content in the main layer. The results were as shown in Table 1.

Example 5 (Comparison)

For comparison, reference is made to the pellicle disclosed in Patent Literature 3 (JP2017-522590A). In this pellicle, the main layer is a Si₃N4 layer having a thickness of 22 nm, and the protective layer is a Ru layer having a thickness of 2 nm. In this pellicle, it was read that the IR absorption (=absorptivity=emissivity) at a wavelength of 2 μm is 35% (theoretical value: 20%) from FIG. 12 of the same literature (a graph with the wavelength of IR light as the horizontal axis and the IR absorption of the pellicle as the vertical axis). The theoretical value of the EUV transmittance of the pellicle was calculated to be 78.8%. Table 1 shows the results.

TABLE 1

| | | Example 1 | Example 2 | Example 3 | Example 4 | Example 5* |
|---|---|---|---|---|---|---|
| Amount of Si added (at %) | | 0 | 10 | 20 | 40 | 0 |
| Main layer | IR emissivity (%) | 19.7 | 24.5 | 23.3 | 22.1 | — |
| Protective layer | IR transmittance (%) | | | 89 | | — |
| EUV transmissive membrane | IR transmittance (%) | 3.3 | 7.7 | 14.4 | 23.8 | — |
| | IR reflectance (%) | 79.2 | 70.5 | 64.8 | 56.5 | — |
| | IR emissivity (%) | 17.5 | 21.8 | 20.8 | 19.7 | 35 |
| | EUV transmittance (%) | 91.8 | 91.5 | 91.1 | 91.3 | 78.8 |

*denotes comparative example.

The EUV transmissive membranes in Examples 1 to 4 had higher EUV transmittance and IR emissivity. Particularly, for IR light having a wavelength of 2 μm, the IR emissivity of the EUV transmissive membrane without Si in the main layer (Example 1) was 17.5%, while IR emissivities of the EUV transmissive membranes with Si content of 10, 20, and 40 at % in the main layer (Examples 2, 3, and 4) were 21.8%, 20.8%, and 19.7%, respectively, which were all high.

What is claimed is:

1. An extreme ultraviolet (EUV) transmissive membrane having an EUV transmittance of 80.0% or more at a wavelength of 13.5 nm, the EUV transmissive membrane comprising:

a main layer having an IR emissivity of 2.0% or more at a wavelength of 2 μm; and a protective layer that covers at least one side of the main layer and has an IR transmittance of 70% or more at a wavelength of 2 μm;

wherein the main layer comprises at least one selected from the group consisting of Be and B₄C as a main component;

wherein the main layer has a thickness of 10 to 70 nm;

wherein the protective layer has a thickness of 5 nm or less; and wherein the protective layer is composed of at least one selected from the group consisting of calcium fluoride, silicon dioxide, and beryllium nitride.

2. The EUV transmissive membrane according to claim 1, wherein both sides of the main layer are covered with a pair of the protective layer.

3. The EUV transmissive membrane according to claim 1, wherein the main layer comprises an additive.

4. The EUV transmissive membrane according to claim 3, wherein a constituent element of the additive has an electronegativity that is 0.3 or higher or 0.3 or lower than the electronegativity of a major constituent element of the main layer.

5. The EUV transmissive membrane according to claim 3, wherein the additive comprises at least one element selected from the group consisting of Rb, Sr, Y, Nb, Mo, Si, K, Ca, B, and C.

6. The EUV transmissive membrane according to claim 3, wherein the main layer comprises Be as a main component, and the content of the additive is 5 to 40 at % with respect to the content of Be in the main layer.

* * * * *